US011990173B2

(12) United States Patent
Ayyapureddi

(10) Patent No.: US 11,990,173 B2
(45) Date of Patent: May 21, 2024

(54) DYNAMIC ROW HAMMERING THRESHOLD FOR MEMORY

(71) Applicant: Micron Technology, Inc., Boise, ID (US)

(72) Inventor: Sujeet V. Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 17/809,144

(22) Filed: Jun. 27, 2022

(65) Prior Publication Data

US 2023/0395120 A1 Dec. 7, 2023

Related U.S. Application Data

(60) Provisional application No. 63/365,735, filed on Jun. 2, 2022.

(51) Int. Cl.
*G11C 11/406* (2006.01)

(52) U.S. Cl.
CPC .. *G11C 11/40618* (2013.01); *G11C 11/40615* (2013.01); *G11C 11/40622* (2013.01)

(58) Field of Classification Search
CPC ........ G11C 11/40615; G11C 11/40618; G11C 11/40622
See application file for complete search history.

(56) References Cited

U.S. PATENT DOCUMENTS

| | | | | |
|---|---|---|---|---|
| 9,032,141 B2* | 5/2015 | Bains | ................... | G06F 13/1636 711/106 |
| 9,865,326 B2* | 1/2018 | Bains | ................ | G11C 11/40618 |
| 10,825,534 B2* | 11/2020 | Nale | ................... | G11C 11/4087 |

* cited by examiner

*Primary Examiner* — Son L Mai
(74) *Attorney, Agent, or Firm* — Holland & Hart LLP

(57) ABSTRACT

Methods, systems, and devices for a dynamic row hammering threshold for memory are described. A memory device may implement a dynamic threshold, such as a threshold quantity of activate operations or a row hammering threshold, for a set of multiple rows of the memory device. For example, the memory device may determine a quantity of rows which exceed a row hammering threshold during a refresh duration and a total quantity of activate operations performed across the set of rows during the refresh duration, and may alter the dynamic threshold based on the quantity of rows, the quantity of activate operations, or both. By altering the dynamic threshold, the memory device may decrease a likelihood that a relatively large quantity of refresh operations for rows that are close to being hammered occur within a short time span.

20 Claims, 7 Drawing Sheets

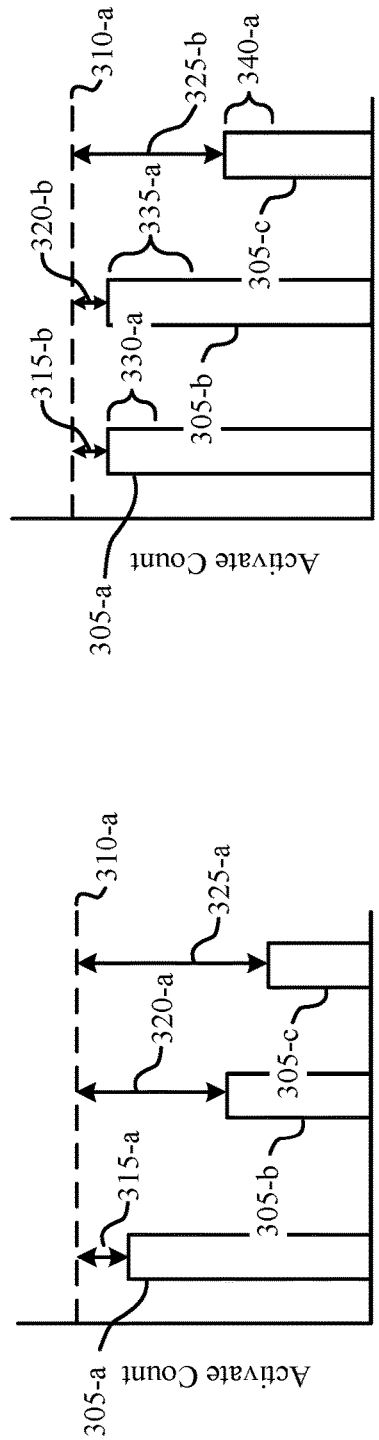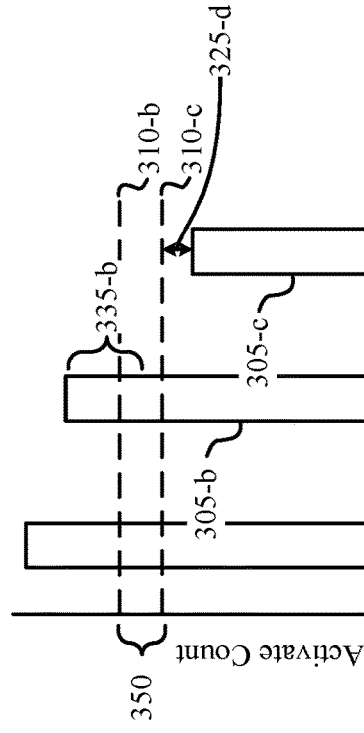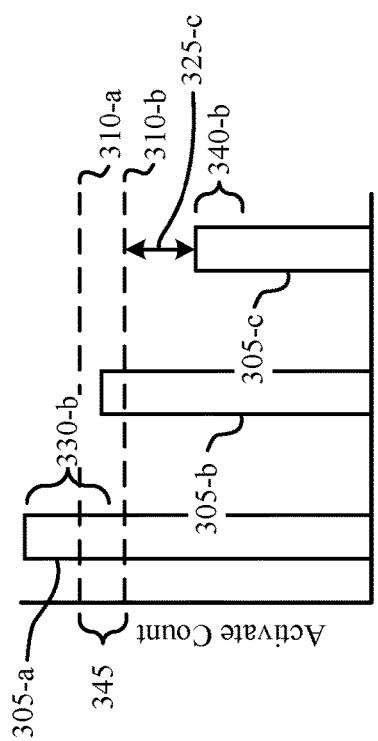
FIG. 3A
FIG. 3B
FIG. 3C
FIG. 3D

DYNAMIC ROW HAMMERING THRESHOLD FOR MEMORY

CROSS REFERENCE

The present application for Patent claims the benefit of U.S. Provisional Patent Application No. 63/365,735 by AYYAPUREDDI, entitled "DYNAMIC ROW HAMMERING THRESHOLD FOR MEMORY," filed Jun. 2, 2022, assigned to the assignee hereof, and expressly incorporated by reference herein.

FIELD OF TECHNOLOGY

The following relates to one or more systems for memory, including dynamic row hammering threshold for memory.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 3A-3D illustrate examples of row counter diagrams that support dynamic row hammering threshold for memory in accordance with examples as disclosed herein.

DETAILED DESCRIPTION

Figure 1:
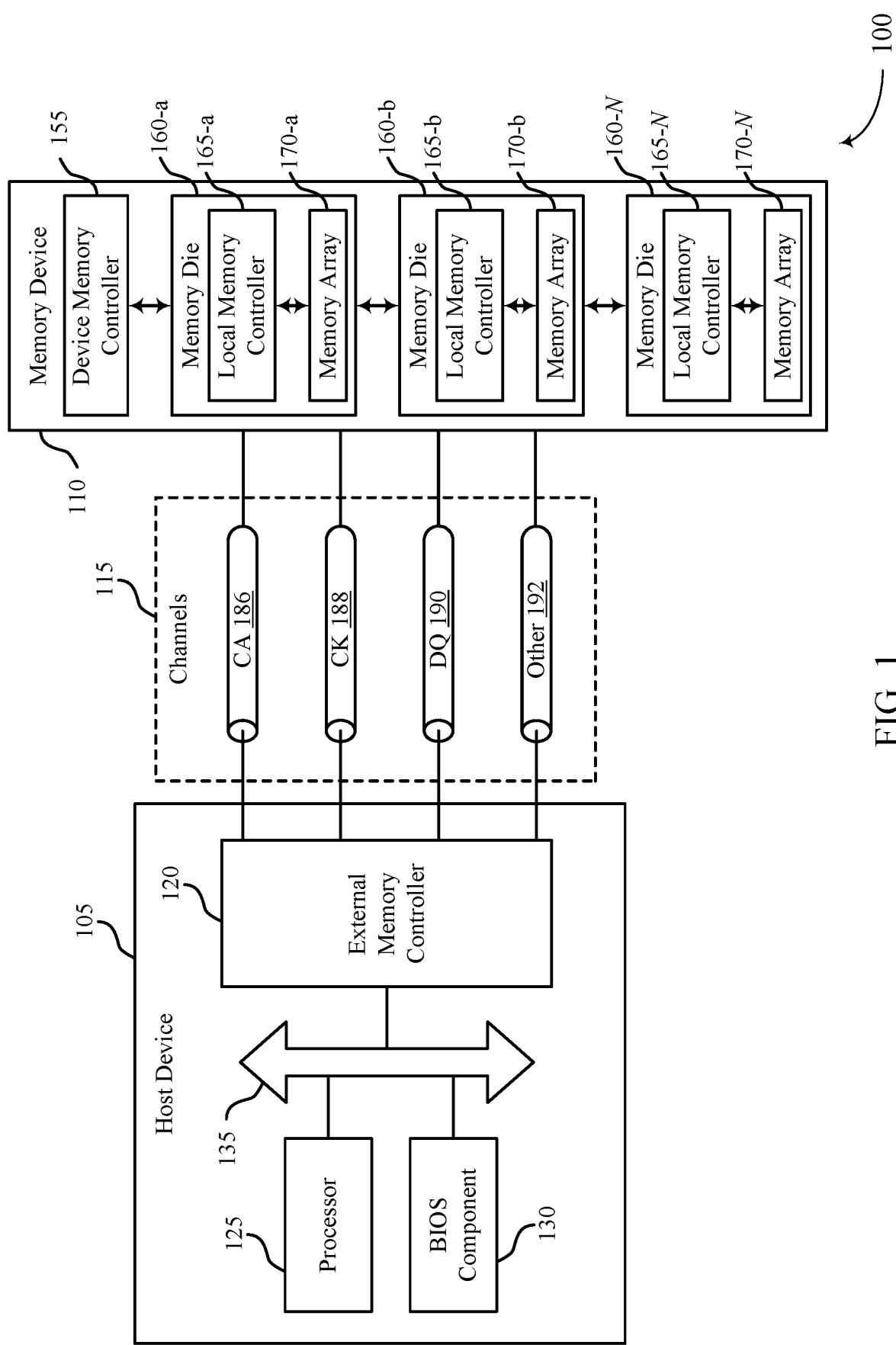
FIG. 1 illustrates an example of a system that supports dynamic row hammering threshold for memory in accordance with examples as disclosed herein.

A memory device may include a set of multiple rows of memory cells (e.g., a bank of rows, a bank of memory), and may track (e.g., count) a respective quantity of activate operations (e.g., read operations, write operations) performed on each row of the set of rows. If the quantity of activate operations performed on one of the rows exceeds a threshold (e.g., a row hammering threshold), the memory device may perform a refresh operation (e.g., row refresh operation) on rows adjacent to the row (e.g., a previous row and a next row) to mitigate the effects of row hammering, and the respective activate counts for the row may be reset. However, if a relatively high quantity of rows exceeds the threshold, a relatively higher quantity of associated refresh operations may lead to an increased amount of time and resources utilized to perform such refresh operations. As such, a hacker or other security risk may take advantage of this to continue to hammer affected rows corrupt data (e.g., or otherwise compromise the memory device) by issuing activate commands. In one example (e.g., a waterfall attack), a hacker may issue activate commands to increment counts for a relatively large quantity of rows to values near the threshold (e.g., below, just below the threshold). Subsequently, the hacker may issue activate commands to increment the relatively large quantity of rows to values that exceed the threshold within a short time span. Such an attack may overwhelm protections implemented by the memory system. For example, the memory device may attempt to perform refresh operations corresponding to the relatively large quantity of rows, which may result in additional time for the hacker to perform the row hammering.

In order to reduce such security risks, the memory device may implement a dynamic threshold (e.g., threshold quantity of activate operations, row hammering threshold). For example, the memory device may determine a quantity of rows which exceed the row hammering threshold and a total quantity of activate operations (e.g., performed across the set of rows) during the refresh duration, and may alter (e.g., reduce) the dynamic threshold based on the quantity of rows, the quantity of activate operations, or both. For example, the memory device may determine that the quantity of rows exceeding the row hammering threshold is greater than (e.g., exceeds, satisfies) a threshold quantity of rows, and may reduce the dynamic threshold. Additionally or alternatively, the memory device may determine that a total quantity of activate operations may exceed a second threshold (e.g., second threshold quantity of activate operations), and may reduce the dynamic threshold. By altering the dynamic threshold, the memory device may decrease a likelihood that a relatively large quantity of refresh operations for rows that are close to being hammered (e.g., close to the original threshold) occur within a short time span (e.g., in accordance with a malicious attack). For example, based on the reduced threshold (e.g., dynamic threshold), rows may begin to be refreshed relatively sooner in comparison with a static threshold, which may increase a time for rows to be refreshed before being in danger of being hammered.

Features of the disclosure are initially described in the context of systems and dies as described with reference to FIGS. 1 and 2. Features of the disclosure are described in the context of row count diagrams, an information flow chart, and a timing diagram as described with reference to FIGS. 3A-5. These and other features of the disclosure are further illustrated by and described with reference to an apparatus diagram and flowcharts that relate to dynamic row hammering threshold for memory as described with reference to FIGS. 6 and 7.

FIG. 1 illustrates an example of a system 100 that supports dynamic row hammering threshold for memory in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other nonvolatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In order to reduce security risks, a memory device 110 may implement a dynamic threshold (e.g., threshold quantity of activate operations, row hammering threshold) for rows of memory of the memory device 110. For example, the memory device 110 may determine a quantity of rows (e.g., of a set of multiple rows, a bank of rows) which exceed a row hammering threshold and a total quantity of activate operations (e.g., performed across the set of multiple rows) during the refresh duration, and may alter (e.g., reduce) the dynamic threshold based on the quantity of rows, the quantity of activate operations, or both. By altering the dynamic threshold, the memory device 110 may decrease a likelihood that a relatively large quantity of refresh operations for rows that are close to being hammered (e.g., close to an original threshold) occur within a short time span (e.g., in accordance with a malicious attack). For example, based on the reduced threshold (e.g., dynamic threshold), rows may begin to be refreshed relatively sooner in comparison with a static threshold, which may increase a time for rows to be refreshed before being in danger of being hammered.

Figure 2:
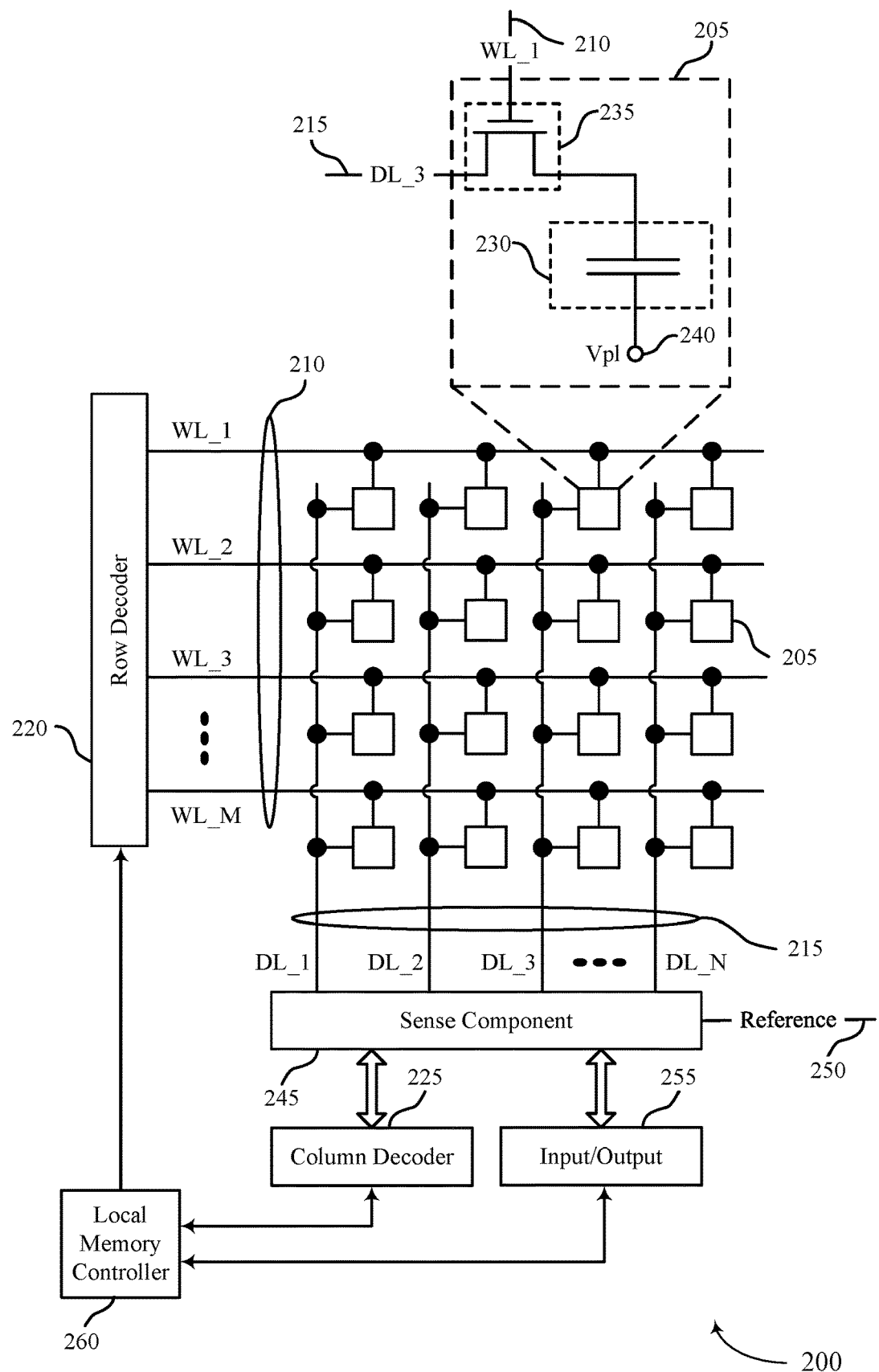
FIG. 2 illustrates an example of a memory die that supports dynamic row hammering threshold for memory in accordance with examples as disclosed herein.

FIG. 2 illustrates an example of a memory die 200 that supports dynamic row hammering threshold for memory in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In order to reduce security risks, a memory device (e.g., implementing or including a memory die 200) may implement a dynamic threshold (e.g., threshold quantity of activate operations, row hammering threshold) for rows of memory of the memory device. For example, the memory device may determine a quantity of rows (e.g., of a set of multiple rows, a bank of rows) which exceed a row hammering threshold and a total quantity of activate operations (e.g., performed across the set of multiple rows) during the refresh duration, and may alter (e.g., reduce) the dynamic threshold based on the quantity of rows, the quantity of activate operations, or both. By altering the dynamic threshold, the memory device may decrease a likelihood that a relatively large quantity of refresh operations for rows that are close to being hammered (e.g., close to an original threshold) occur within a short time span (e.g., in accordance with a malicious attack). For example, based on the reduced threshold (e.g., dynamic threshold), rows may begin to be refreshed relatively sooner in comparison with a static threshold, which may increase a time for rows to be refreshed before being in danger of being hammered.

FIGS. 3A, 3B, 3C, and 3D illustrate examples of row count diagrams 300 that support dynamic row hammering threshold for memory in accordance with examples as disclosed herein. Row count diagrams 300 may illustrate the operation of a memory device described with reference to FIGS. 1 and 2. The memory device may be an example of a memory device 110 described with reference to FIG. 1, which may include one or more memory dies 200 as described with reference to FIG. 2. The row count diagrams 300 may depict plots of activate counters corresponding to rows of the memory device at different times during a refresh duration. The row count diagrams 300 may illustrate the operation of the memory device (e.g., activate operations, refresh operations) based on, or associated with, the counter values.

In some cases, the memory device may operate in accordance with a refresh duration. As described herein, a refresh duration may be a time duration (e.g., 64 milliseconds (ms), 32 ms) over which each row of a set of multiple rows (e.g., each row in or associated with a bank of memory) may be refreshed by the memory device. Additionally or alternatively, a refresh duration may be a time between refresh operations performed on a given row, such that the row may be refreshed at least every refresh duration (e.g., if not more frequently). The memory device may perform activate operations during the refresh duration, in which, for example, the memory device may support a finite quantity of activate operations during the refresh duration (e.g., a limited quantity, such as by a time of the refresh duration). For example, the memory device may support a quantity (e.g., a maximum quantity, if activate operations are performed continuously) of activate operations (e.g., across a bank of memory) given by an equation such as equation (1).

$$ACT=(tREF-\text{Refresh Count}*tRFC)/tRC \quad (1)$$

ACT may represent the quantity of activate operations, tREF may represent the refresh duration, Refresh Count may represent a quantity of refresh operations (e.g., 8,000 refresh operations) performed for the rows within the refresh duration, tRFC may represent a time duration (e.g., 250 nanoseconds (ns) to 300 ns) associated with a refresh operation (e.g., a time to perform the refresh operation), and tRC may represent a time duration associated with an activate operation (e.g., a time to perform the activate operation, a time between consecutive activate operations).

As described herein, an activate command may be a command (e.g., a standardized command) that may indicate for a memory device to activate a word line and/or a digit line(s) associated with one or more memory cells on a row. As such, the data stored at the memory cells may be accessed in order to perform an operation, such as a write operation, a read operation, or a memory management operation, among other examples. As described herein, the memory device may perform a refresh operation to refresh logical values (e.g., data) stored at cells in a row of memory, such that the logical values may be stabilized at the respective cells for a time period following the refresh operation. A refresh operation may mitigate the effects of row hammering, in which, for example, the memory device may perform refresh operations on one or more rows adjacent to row(s) that have been frequently accessed (e.g., in accordance with issued activate commands to "hammer" the adjacent rows).

During (e.g., within) the refresh duration, the memory device may perform refresh operations (e.g., standard refresh operations) on a set of multiple of rows (e.g., rows within or associated with a bank of memory) to mitigate the effects of row hammering (e.g., leakage) on one or more of the rows. For example, the memory device may perform refresh operations (e.g., during the refresh duration) on rows adjacent (e.g., a next or previous row) to one or more rows which may have undergone a relatively large quantity of activate operations (e.g., exceeding a threshold quantity), because the activate operations may affect a data storage capability or integrity of the adjacent rows. The memory device may track a quantity of activate operations associated with each row (e.g., in accordance one or more counters), and, if the quantity of activate operations associated with a respective row exceeds a threshold (e.g., a static threshold, a row hammer threshold), the memory device may perform a refresh operation on rows adjacent to the respective row. In such cases, the row on which the activate operations is performed, or the adjacent row(s) may be considered hammered, which may degrade memory performance, and may, in some cases, corrupt data stored at the row(s). Because a finite quantity of activate operations may be performed during a refresh duration, the memory device may only perform a finite quantity of refresh operations during the refresh duration as well (e.g., a limited quantity, such as by a time of the refresh duration).

However, performing refresh operations within the refresh duration may take time and may utilize resources of the memory device, such that performing a relatively large quantity of refresh operations within a short time span (e.g., within the refresh duration) may be unfeasible for the memory device. As such, if a relatively large quantity of activate operations is performed on one or more rows within a short time span (e.g., within a refresh duration), such operations may lead the memory device to temporarily lock out (e.g., stop performing activate operations). Additionally or alternatively, the relatively large quantity of activate operations may lead to data corruption on memory cells associated with rows adjacent to the one or more rows (e.g., because the memory device may be unable to refresh each affected row within the refresh duration). For example, in some cases (e.g., if activate operations are performed continuously within a refresh duration), a quantity of hammered rows (e.g., a maximum quantity) may be equal to a total quantity of activate operations performed within the refresh duration divided by the row hammer threshold (e.g., the threshold quantity of activate operations), which may indicate a total quantity of rows that may exceed the row hammer threshold (e.g., hammered rows).

In some examples, a hacker or other security risk may exploit such effects to gain access to or corrupt the memory device as part of a malicious attack (e.g., waterfall attack). For example, a hacker may attempt to manipulate the memory device to perform a large proportion of rows to a relatively high quantity of activate operations (e.g., above the threshold) within a short time span (e.g., within a refresh duration) to overwhelm the memory device. In such examples, the hacker may transmit activate commands (e.g., corresponding to specific rows) to the memory device to increment counters associated with the rows to values near (e.g., just below) the threshold, and, within the same refresh duration, may transmit additional activate commands to increment the counters of the rows to exceed (e.g., satisfy) the threshold within a short time span, leading to a relatively large backlog of rows to refresh. Accordingly, the memory device may become overwhelmed and may temporarily shut down, or data on rows adjacent to the attacked rows may be corrupted. Because each row is refreshed at least one time per refresh duration, a refresh duration may define a limit of when a waterfall attack, or other security risk, may occur.

In accordance with aspects of the present disclosure, the memory device may utilize a dynamic threshold (e.g., associated with tracking activate operations, for each row) to mitigate the risk of a waterfall attack. For example, the memory device may track a quantity of rows that exceed the dynamic threshold during the refresh duration (e.g., using dedicated circuitry, using a controller such as a Compute Express Link (CXL) controller with content-addressable memory (CAM)), and may track a total quantity of activate operations performed (e.g., activate commands issued). The memory device may alter (e.g., reduce) the dynamic threshold based on the quantity of rows that exceed the dynamic threshold and the total quantity of activate operations, where the memory device may compare the quantity of rows to a row threshold (e.g., a percentage of possible rows that may exceed the dynamic threshold within the refresh window, a percentage of a theoretical maximum quantity of rows that may exceed the dynamic threshold within the refresh window) and reduce the dynamic threshold accordingly.

As such, the memory device may perform refresh operations on rows associated with relatively lower activate counts (e.g., rather than waiting to perform the refresh operations until the activate count is relatively high), giving the memory device a buffer to prevent multiple rows from having a relatively high activate count at the same time. Accordingly, a hacker may be unable to increment a relatively large quantity of rows to relatively high values of activate counts (e.g., in order to compromise data) above the dynamic threshold (e.g., as the dynamic threshold may change), which may prevent or reduce the effects of a waterfall attack.

The row count diagrams 300 may depict row counters at different points in time during a refresh duration. The row count diagrams 300 may include row counters 305 (e.g., corresponding to a subset of rows of the memory device), which may each count a quantity of activate operations performed by a respective row. Although three row counters 305 are illustrated, it is to be understood that any quantity of row counters 305 (e.g., less than, equal to, or greater than a total quantity of rows) may be implemented at a memory device according to the techniques described herein. The row count diagrams 300 may illustrate the operation of the memory device in accordance with the row counters 305, relative to a dynamic threshold.

Row count diagram 300-a may depict the row counters 305 at a first time within a refresh duration. At the first time in the refresh duration, the dynamic threshold may be at a value 310-a. A row counter 305-a may have a value of a first quantity of activates, which may be a quantity 315-a less than the dynamic threshold, a row counter 305-b may be a quantity 320-a less than the dynamic threshold (e.g., at value 310-a). Similarly, the row counter 305-b may be a quantity 320-a less than the dynamic threshold and the row counter 305-c may be a quantity 325-a less than the dynamic threshold.

Row count diagram 300-b may depict the row counters 305 at a second time within the refresh duration. For example, the row counter 305-a may be incremented by a quantity 330-a (e.g., quantity of activates) from the first time (e.g., based on activate command issued to, and corresponding activate operations performed on, the row), and may be a quantity 315-b less than the dynamic threshold. Similarly, the row counters 305-b and 305-c may be incremented by a quantity 335-a and 340-a, respectively (e.g., based on respective activate commands issued and performed). The row counter 305-b may therefore be a quantity 320-b less than the dynamic threshold, and the row counter 305-b may be a quantity 325-b less than the dynamic threshold. The dynamic threshold may remain at the value 310-a based on a quantity of the row counters 305 (e.g., zero) that are greater than the value 310-a at the second time and based on a total quantity of activate operations performed (e.g., across all the rows, such as all the rows in a bank or in the memory device).

Row count diagram 300-c may depict the row counters 305 at a third time within the refresh duration. The row counter 305-a may be incremented by a quantity 330-b from the second time, the row counter 305-b may, for example, not be incremented from the second time, and the row counter 305-c may be incremented by a quantity 340-b from the second time. The row counter 305-a may exceed the dynamic threshold at the third time (e.g., may be greater than the value 310-a). Because the row counter 305-a exceeds the dynamic threshold, the memory device may perform a refresh operation on rows adjacent to the row associated with the row counter 305-a (e.g., may schedule the row associated with the row counter 305-a for the refresh operation and may perform the refresh operation accordingly). Based on a quantity of the row counters 305 (e.g., one or more counters) that are greater than the value 310-a and the total quantity of activate operations, the dynamic threshold may be reduced by a quantity 345 to a value 310-b at the third time. Based on the reduced threshold, the row counter 305-b may be greater than the value 310-b, and the row counter 305-c may be a quantity 325-c less than the dynamic threshold. Based on the change in the threshold from value 310-a to 310-b (e.g., because the row counter 305-b exceeds the new dynamic threshold), the memory device may schedule a refresh operation for the row associated with the row counter 305-b (e.g., and may perform the refresh operation accordingly).

Row count diagram 300-d may depict the row counters 305 at a fourth time within the refresh duration. The row counter 305-a may be reset (e.g., set to zero) following the refresh operation performed at the third time. The row counter 305-b may be incremented by a quantity 335-b from the third time (e.g., based on activate commands issued and activate operations performed). In some examples, the memory device (e.g., dedicated circuitry, memory controller, CXL controller) may determine that the row counter 305-b exceeds the dynamic threshold after performing operations corresponding to the quantity 335-b (e.g., may determine that one or more counters exceed the threshold). Based on the quantity of row counters that satisfy (e.g., exceed) the dynamic threshold and the total quantity of activate operations, the dynamic threshold may be reduced by a quantity 350 to a value 310-c at the third time. The row counter 305-c may not be incremented and may be a quantity 325-d less than the dynamic threshold (e.g., at the value 310-c).

Based on the reduction (e.g., change) of the dynamic threshold, the row associated with the row counter 305-b (e.g., and in some cases the row associated with the row counter 305-c) may be flagged relatively sooner (e.g., earlier) for refresh operations, for example, with comparison to a static threshold. As such, the refresh operation(s) may be performed relatively sooner and a waterfall attack may be prevented or reduced (e.g., mitigated) based on performing refresh operations before a row activate count reaches a relatively high quantity, which may prevent data corruption or another form of hacker attack by refreshing a row before reaching a relatively high activate count.

Figure 4:
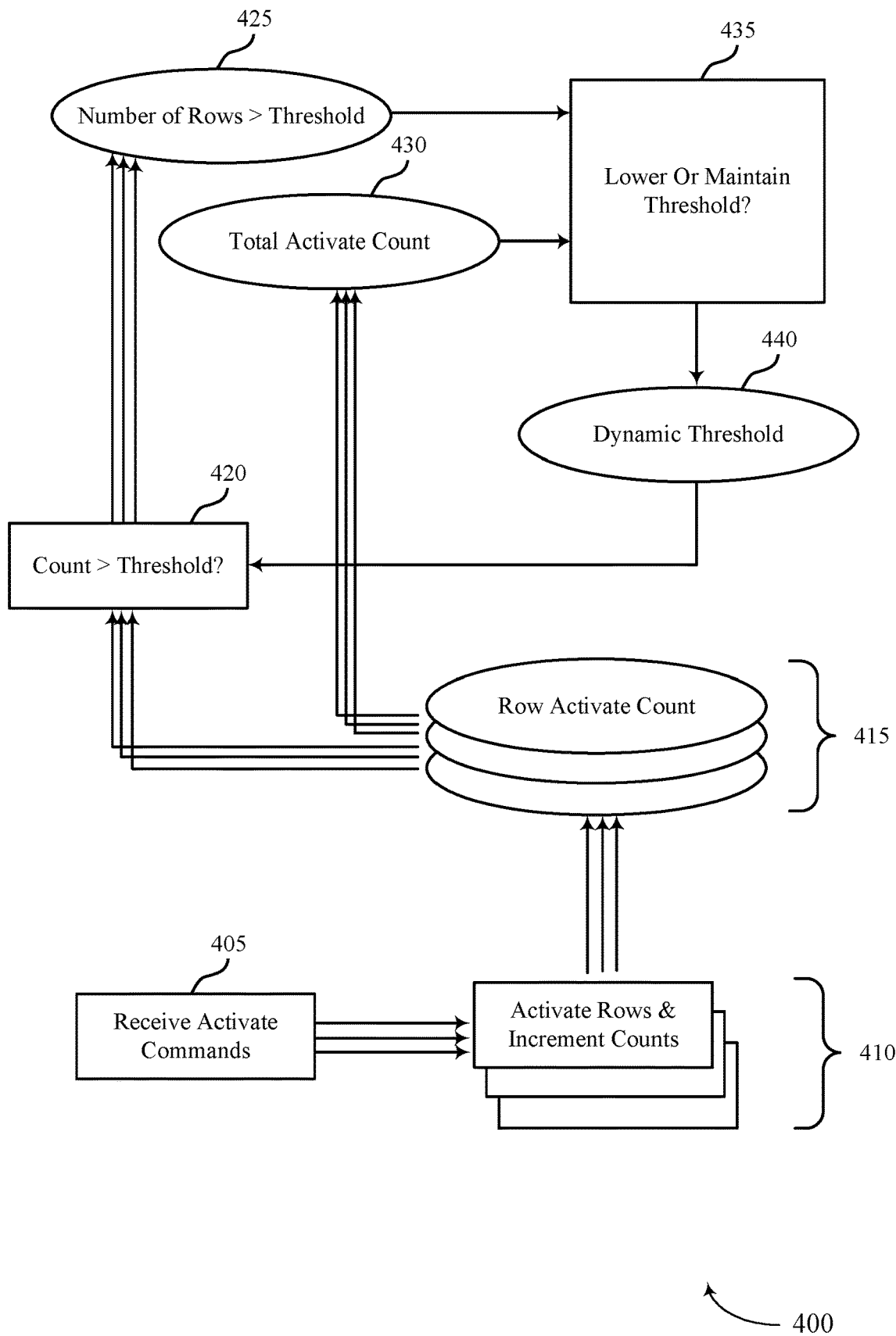
FIG. 4 illustrates an example of an information flow chart that supports dynamic row hammering threshold for memory in accordance with examples as disclosed herein.

FIG. 4 illustrates an example of an information flow chart 400 that supports dynamic row hammering threshold for memory in accordance with examples as disclosed herein. The information flow chart 400 may be implemented by a memory device as described with reference to FIGS. 1-3. The memory device may be an example of a memory device 110 described with reference to FIG. 1, which may include one or more memory dies 200 as described with reference to FIG. 2. The information flow chart 400 may represent the operation of the memory device within a refresh duration, as described with reference to FIGS. 3A-3D. For example, the information flow chart 400 may represent one or more operations performed by the memory device, and corresponding information used, in order to implement a dynamic threshold for activate counts as described with reference to FIGS. 3A-3D.

In some examples, the memory device may include a set of multiple rows (e.g., a bank of memory, which may include or be associated with the rows), and may track (e.g., count) activate operations performed at each rows of the set of rows. For example, each row of the set of rows may maintain a respective activate count (e.g., within the memory cells of the row), and/or a CXL controller may maintain a subset of counts corresponding to a subset of the set of rows (e.g., a subset of rows with a highest count). The memory device may total (e.g., sum) the counts to determine a total quantity of activate operations across the plurality of rows (e.g., bank of rows) at the CXL controller or at dedicated circuitry. The CXL controller may be an example of a device memory controller 155, a local memory controller 165, or a local memory controller 260, and may include one or more counters as described herein. The dedicated circuitry may include circuitry implementing the counters, and a register (e.g., mode register), to determine and store a value corresponding to the quantity of activate operations across the set of rows.

In some cases, one or more aspects of the information flow chart 400 may be implemented by a controller (e.g., among other components) of the memory device. Additionally or alternatively, aspects of the information flow chart 400 may be implemented as instructions stored in the memory device, or by circuitry (e.g., dedicated circuitry) of the memory device. For example, the instructions, if executed by the controller, may cause the memory device to perform one or more operations of the information flow chart 400. Alternative examples of the information flow chart 400 may be implemented in which some operations are performed in a different order than described or are not performed at all. In some cases, operations may include features not mentioned below, or additional operations may be added.

At 405, the memory device may receive activate commands (e.g., may receive multiple activate commands over a period of time). For example, the memory device may receive activate commands from a host device (e.g., a host device 105). The activate commands may be associated with one or more rows of the set of rows (e.g., of the bank). In some examples, one or more of the activate commands may be associated with a same row.

At 410, the memory device may activate respective rows indicated by the corresponding activate commands, and increment respective row activate counts 415 associated with the activated rows. The memory device may activate rows in response to the activate commands received at 405. For example, the memory device may activate the rows (e.g., perform activate operations thereon) indicated by the activate commands, and may increment the respective row activate counts 415 based on performing the activate operations on the rows. The memory device may maintain (e.g., store) the row activate counts 415, such as at memory cells in corresponding rows or at a CXL controller of the memory device. The memory device may also update a total activate count 430 (e.g., second quantity of activate operations) for the set of rows (e.g., for all rows in the set, all rows in the bank) based on the row activate counts 415, and may maintain (e.g., store) the total activate count 430 at the CXL controller or at dedicated circuitry.

At 420, the memory device may determine whether one or more row activate counts 415 associated with the activated rows satisfy a dynamic threshold 440 (e.g., threshold quantity of activate operations). For example, the memory device may determine whether a row activate count 415 for each activated row (e.g., upon activation, or as a result of activation) of the set of rows exceeds (e.g., satisfies) the dynamic threshold 440. Based on such a determination, the memory device may update a count of a quantity of rows 425 that have row activate counts 415 which exceed the dynamic threshold 440. If a row activate count 415 exceeds the dynamic threshold 440, the memory device may set a flag to perform a refresh operation on a row associated with the row activate count 415 and/or on the rows adjacent to the row. The memory device may perform refresh operations on flagged rows within a refresh duration (e.g., in accordance with a refresh frequency). In some examples, the memory device may update (e.g., reset, set to zero) a row activate count 415 corresponding to a refreshed row (e.g., following the refresh operation), or corresponding to a row adjacent to the refreshed row, and the memory device may update (e.g., decrement) the quantity of rows 425 accordingly.

At 435, the memory device may determine whether to lower (e.g., adjust) or maintain the dynamic threshold 440. For example, the memory device may determine whether to lower or maintain the dynamic threshold 440 based on the quantity of rows 425, the total activate count 430, a combination thereof, or based on one or more other parameters. In some cases, the quantity of rows 425 may exceed a threshold quantity of rows, where the threshold quantity of rows may be based on a duration between activate commands (e.g., frequency of activate commands) and the refresh duration. For example, the threshold quantity of rows may be a proportion (e.g., percentage) of rows which exceed the dynamic threshold 440 to a total quantity of rows (e.g., total possible quantity of rows) which may exceed the dynamic threshold 440 during the refresh duration.

Additionally or alternatively, the total activate count 430 may exceed a second threshold (e.g., second threshold quantity of activate operations). Based on the quantity of rows 425 (e.g., which may exceed a threshold quantity of rows), the total activate count 430 (e.g., which may exceed a second threshold quantity of activate operations), or both, the memory device may alter (e.g., reduce) the dynamic threshold 440. In one example, different combinations of the quantity of rows 425 and the total activate count 430 may result in respective actions taken by the memory device for reducing the dynamic threshold 440. For example, each combination of the quantity of rows 425 and the total activate count 430 may be associated with a respective value of the dynamic threshold 440, or a respective value for reducing the dynamic threshold 440, or the quantity of rows 425 and the total activate count 430 may be otherwise evaluated together (e.g., using an equation or an algorithm) to determine the dynamic threshold 440.

The memory device may alter the value of the dynamic threshold 440 by a variable quantity in accordance with one or more parameters (e.g., the quantity of rows 425, the total activate count 430). In other cases, the memory device may maintain the value of the dynamic threshold 440. For example, the memory device may determine to maintain the value of the dynamic threshold 440 if the quantity of rows 425 does not exceed the threshold quantity of rows and/or the total activate count 430 does not exceed the second threshold.

The memory device may continue to operate in accordance with the operations as described herein. For example, the memory device may continue to perform activate operations (e.g., in accordance with received activate commands), refresh operations, update counts (e.g., row activate count 415, total activate count 430, quantity of rows 425), and adjust the dynamic threshold 440, as described herein. In some cases (e.g., when the dynamic threshold 440 is lowered or altered), determining whether a row activate count 415 has exceeded the dynamic threshold 440 may include comparing the row activate count 415 to the newly set dynamic threshold 440. In such cases, if the row activate count 415 exceeds the new dynamic threshold 440, the quantity of rows 425 may be updated and the row associated with the row activate count 415 may be scheduled for a refresh operation. Accordingly, the memory device may operate in such a manner to reduce the likelihood of a waterfall attack. For example, by implementing a dynamic threshold 440, the memory device may prevent a backlog of rows to refresh by performing refresh operations at relatively lower quantities of activate operations (e.g., in accordance with the dynamic threshold 440). Moreover, because the dynamic threshold 440 changes (e.g., updates), a hacker may not be able to increment a relatively high quantity of rows to values near (e.g., below, just below) the dynamic threshold 440.

In some cases, one or more thresholds (e.g., the dynamic threshold 440, the threshold quantity of rows, the second threshold) may be randomized or otherwise varied. For example, the dynamic threshold 440 (e.g., at the start of the refresh duration) may be randomized within a range (e.g., between an upper and lower limit, according to a distribution centered on a nominal value, such as the dynamic threshold 440) or may be randomize between a value of 1 and an upper limit (e.g., the dynamic threshold 440). Additionally or alternatively, the dynamic threshold 440 may be randomized for each row, where one or more rows of the set of rows may each be associated with a different, respective dynamic threshold 440 (e.g., which may be randomized for each row within a range as described herein).

In some cases, the memory device may alter (e.g., increase) the frequency at which refresh operations occur on rows that satisfy the dynamic threshold 440 within the refresh duration. For example, the memory device may increase the frequency based on the quantity of rows 425 (e.g., exceeding the threshold quantity of rows) and/or the total activate count 430 (e.g., exceeding the second threshold). By increasing the frequency of refresh operations, the memory device may further reduce the likelihood of a waterfall attack because rows are mitigated (e.g., refreshed) more quickly (e.g., more frequently, such as with respect to receiving activate commands and performing the associated operations). In some cases (e.g., when implementing the described techniques using a CXL controller), one or more elements of CAM of the CXL controller may be refreshed more frequently (e.g., based on how full the CAM is).

Figure 5:
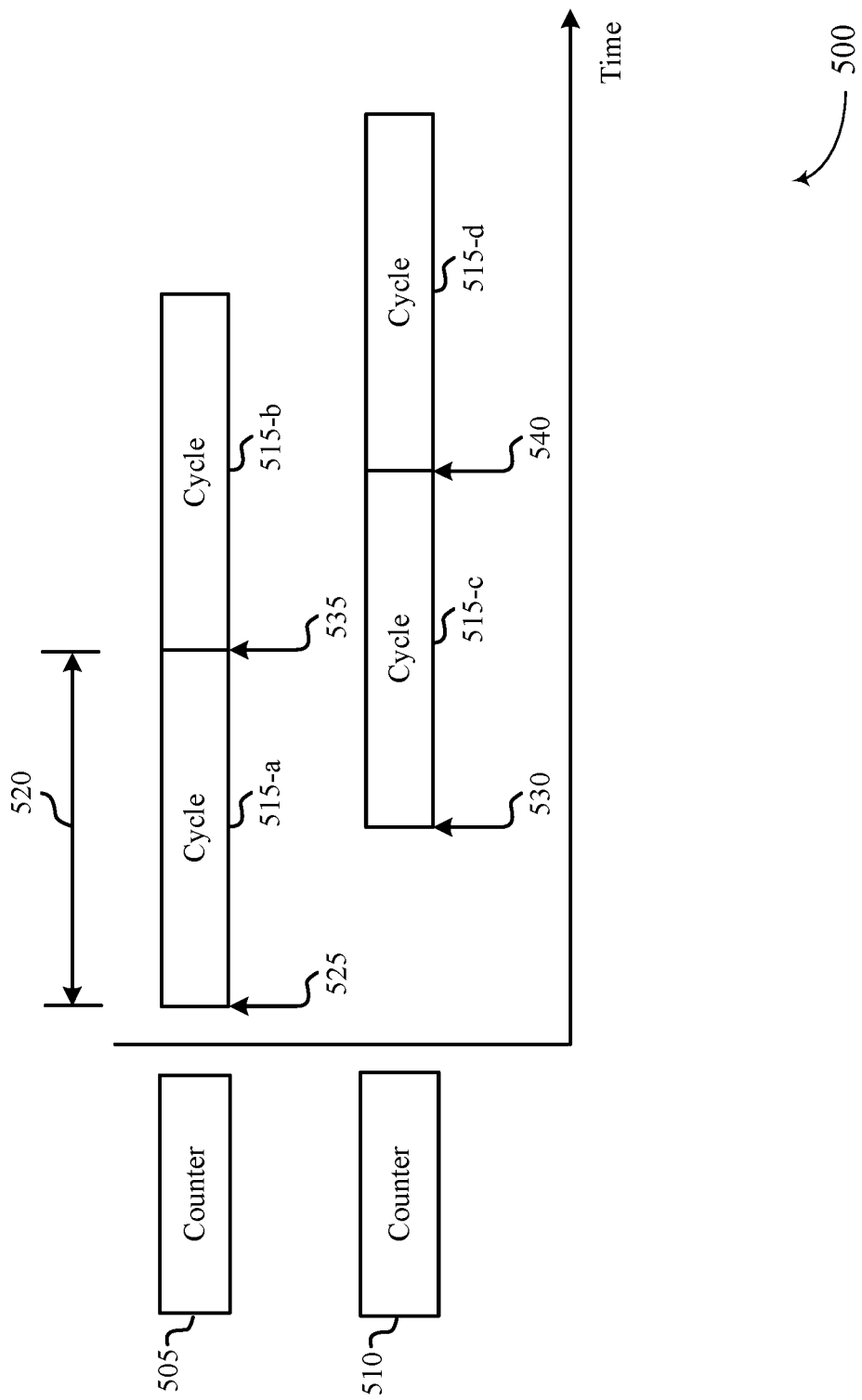
FIG. 5 illustrates an example of a timing diagram that supports dynamic row hammering threshold for memory in accordance with examples as disclosed herein.

FIG. 5 illustrates an example of a timing diagram 500 that supports dynamic row hammering threshold for memory in accordance with examples as disclosed herein. The timing diagram 500 may depict operation of a memory device as described with reference to FIGS. 1-4. The memory device may be an example of a memory device 110 described with reference to FIG. 1, which may include one or more memory dies 200 as described with reference to FIG. 2. The memory device may include a counter 505 (e.g., first counter) and a counter 510 (e.g., second counter). The counter 505 and the counter 510 may count a quantity of rows that exceed a threshold quantity of activate operations (e.g., across a set of multiple rows of the memory device, such as rows within a bank) during a refresh duration.

In some examples, the counter 505 and the counter 510 may track a quantity of rows that exceed the threshold during a cycle 515 (e.g., refresh window, refresh duration), across a set of multiple rows of the memory device. In some examples, the counter 505 and the counter 510 may track a quantity of activate operations (e.g., a total quantity of activate operations) performed by the set of rows. While the examples described herein are associated with tracking a quantity of rows exceeding the dynamic threshold using counter 505 and/or counter 510, the same examples may apply to tracking a quantity of activate operations performed (e.g., a total quantity) without departing from the scope of the present disclosure.

A cycle 515 may last for a duration 520 that may be the refresh duration (e.g., less than or equal to a refresh duration), for example, because a counter 505 or 510 may be unable or incapable of counting for an indeterminate period of time (e.g., or because a refresh duration is a relevant time duration for activate or row counts). The memory device may support a finite quantity of activate operations during a cycle 515, and, as such, a finite quantity of rows (e.g., of the set of rows) may be hammered past a dynamic threshold during a cycle 515. Accordingly, the counter 505 and the counter 510 may track a quantity of rows that exceed the dynamic threshold (e.g., over a cycle 515 or a refresh duration). As described herein (e.g., with reference to FIGS. 3 and 4), the memory device may adjust the dynamic threshold based on a value of the counter 505, the counter 510, or both (e.g., in accordance with the count of the quantity of rows) as described with reference to FIGS. 3 and 4.

At a time 525 (e.g., at a beginning of a cycle 515-a), the counter 505 (e.g., first counter) may reset (e.g., refresh) or otherwise begin to track rows that exceed the dynamic threshold within the cycle 515-a. During the cycle 515-a, the counter 505 may track the quantity of rows that exceed the dynamic threshold (e.g., with respect to a nominal value, with respect to zero) or the quantity of activate operations performed (e.g., a total quantity). The counter 510 may be offset from the counter 505 by half, or about half, of the value of the duration 520 (e.g., half of a cycle 515), such that when one counter (e.g., counter 505 or counter 510) is reset (e.g., refreshed) at least some information may be retained by the other counter (e.g., counter 510 or counter 505, respectively). Accordingly, at a time 530 (e.g., at a beginning of a cycle 515-c), the counter 510 may reset or begin to track rows that exceed the dynamic threshold within the cycle 515-c, such that the cycle 515-c may at least partially overlap with the cycle 515-a. At a time 535, the cycle 515-a may end and a cycle 515-b may begin, such that the counter 505 may reset (e.g., to a nominal value, to zero) and begin to track activate operations in the cycle 515-b. Similarly, at a time 540 (e.g., half a duration 520 after the time 535), the cycle 515-c may end and a cycle 515-d may begin. Accordingly, the counter 510 may reset (e.g., to a nominal value, to zero) and begin to track activate operations in the cycle 515-d.

The memory device may implement the counter 505 and the counter 510 (e.g., two offset counters, implemented in a controller or dedicated circuitry) running in parallel to track the quantity of rows that exceed the dynamic threshold during a refresh duration (e.g., associated with a cycle 515) or the quantity of activate operations that occur during a refresh duration (e.g., associated with a cycle 515). The memory device may, for example, implement two counters (e.g., offset counters) such that a count may be maintained when either the counter 505 or the counter 510 are reset (e.g., may be maintained by the other counter 510 or 505, respectively, which may not be reset at the same time). As described with reference to FIGS. 3 and 4, the memory device may alter (e.g., reduce) the dynamic threshold in accordance with the counter value (e.g., when the counter value is relatively larger, indicating a higher quantity of rows that exceeded the threshold or a higher quantity of total activates).

In some cases, the counter (e.g., either the counter 505 or the counter 510) used for determining to alter the dynamic threshold may be a counter that was reset less recently (e.g., a counter with a higher count or quantity). For example, up to the time 535, the memory device may determine a quantity of rows that exceed the dynamic threshold, or a quantity of activate operations, using a value of the counter 505 (e.g., to support adjustments to the dynamic threshold based on the counter value). In such cases, the memory device may use the counter 505 because the counter 505 was reset or started earlier than the counter 510 and thus may have a larger value (e.g., a longer history of counted rows or activate operations). In another example, the memory device may, from the time 535 up to the time 540, determine a quantity of rows that exceed the dynamic threshold, or a quantity of activate operations, using a value of the counter 510. In such cases, the memory device may use the counter 510 because the counter 510 was reset or started earlier than the counter 505 and thus may have a larger value (e.g., a longer history of counted rows or activate operations).

As described herein, the memory device may adjust the dynamic threshold if the value of the counter 505 or the counter 510 exceeds (e.g., satisfies) a threshold (e.g., a threshold quantity of rows, a second threshold quantity of activate operations) as described with reference to FIGS. 3 and 4.

Figure 6:
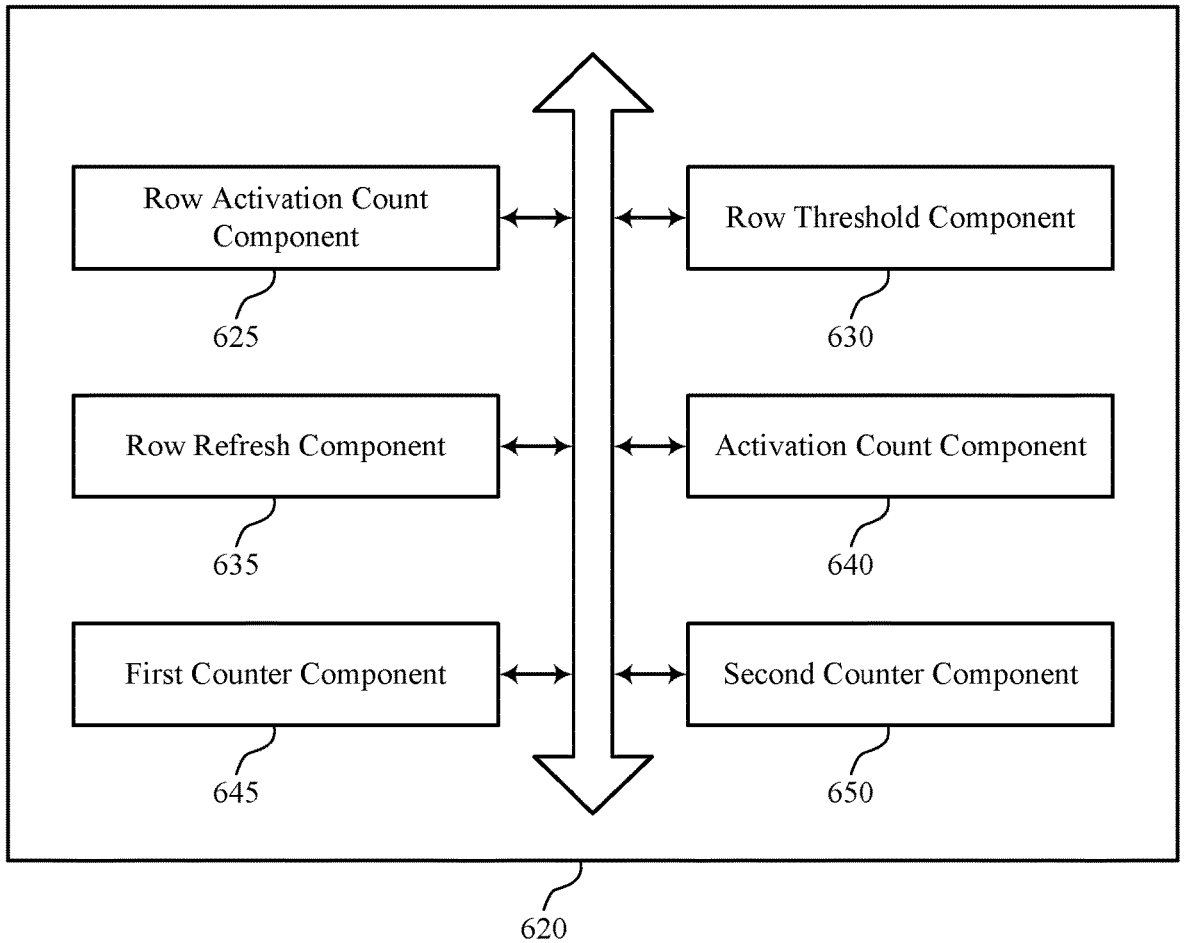
FIG. 6 shows a block diagram of a memory device that supports dynamic row hammering threshold for memory in accordance with examples as disclosed herein.

FIG. 6 shows a block diagram 600 of a memory device 620 that supports dynamic row hammering threshold for memory in accordance with examples as disclosed herein. The memory device 620 may be an example of aspects of a memory device as described with reference to FIGS. 1 through 5. The memory device 620, or various components thereof, may be an example of means for performing various aspects of dynamic row hammering threshold for memory as described herein. For example, the memory device 620 may include a row activation count component 625, a row threshold component 630, a row refresh component 635, an activation count component 640, a first counter component 645, a second counter component 650, or any combination thereof. Each of these components may communicate, directly or indirectly, with one another (e.g., via one or more buses).

The row activation count component 625 may be configured as or otherwise support a means for determining, at a memory device, that a quantity of activate operations performed within a refresh duration on a row of a plurality of rows satisfies a threshold quantity of activate operations, where each row of the plurality of rows is associated with a respective threshold quantity of activate operations. In some examples, the row activation count component 625 may be configured as or otherwise support a means for updating a count of a quantity of rows of the plurality of rows that each satisfy the respective threshold quantity of activate operations based at least in part on determining that the quantity of activate operations performed on the row satisfies the threshold quantity of activate operations. The row threshold component 630 may be configured as or otherwise support a means for determining that the count of the quantity of rows satisfies a threshold quantity of rows within the refresh duration. In some examples, the row threshold component 630 may be configured as or otherwise support a means for setting a value of the threshold quantity of activate operations based at least in part on the count of the quantity of rows satisfying the threshold quantity of rows.

In some examples, to support setting the value of the threshold quantity of activate operations, the row threshold component 630 may be configured as or otherwise support a means for reducing the value of the threshold quantity of activate operations from a first value to a second value that is less than the first value based at least in part on the count of the quantity of rows satisfying the threshold quantity of rows.

In some examples, the row refresh component 635 may be configured as or otherwise support a means for altering a frequency for refreshing the quantity of rows based at least in part on the count of the quantity of rows satisfying the threshold quantity of rows.

In some examples, the activation count component 640 may be configured as or otherwise support a means for identifying a second quantity of activate operations performed across the plurality of rows within the refresh duration, where setting the value of the threshold quantity of activate operations is based at least in part on the second quantity of activate operations.

In some examples, the activation count component 640 may be configured as or otherwise support a means for determining that the second quantity of activate operations is greater than a second threshold quantity of activate operations, where setting the value of the threshold quantity of activate operations includes reducing the value of the threshold quantity of activate operations based at least in part on the second quantity of activate operations satisfying the second threshold quantity of activate operations.

In some examples, the threshold quantity of rows is based at least in part on a duration between activate commands and the refresh duration.

In some examples, the threshold quantity of activate operations associated with the row is the same as other threshold quantities of activate operations associated with other rows of the plurality of rows.

In some examples, the threshold quantity of activate operations associated with the row is different than other threshold quantities of activate operations for other rows of the plurality of rows. In some examples, the other threshold quantities of activate operations for the other rows vary within a range of quantities that includes the threshold quantity of activate operations.

In some examples, variations between threshold quantities of activate operations within the range of quantities are randomly generated.

In some examples, the row threshold component 630 may be configured as or otherwise support a means for setting a corresponding value for each respective threshold quantity of activate operations associated with each row of the plurality of rows based at least in part on the count of the quantity of rows satisfying the threshold quantity of rows, where setting the value of the threshold quantity of activate operations is based at least in part on setting the corresponding values for the respective threshold quantities of activate operations.

In some examples, the first counter component 645 may be configured as or otherwise support a means for determining a first value of a first counter associated with a first time period less than or equal to the refresh duration, where the count of the quantity of rows is based at least in part on the first value of the first counter. In some examples, the second counter component 650 may be configured as or otherwise support a means for determining a second value of a second counter associated with a second time period less than or equal to the refresh duration, where the second time period starts after the first time period and at least partially overlaps with the first time period.

In some examples, updating the count of the quantity of rows is based at least in part on information associated with the plurality of rows stored in a content-addressable memory.

In some examples, the row activation count component 625 may be configured as or otherwise support a means for reducing the count of the quantity of rows based at least in part on performing a refresh operation for one or more rows of the quantity of rows.

In some examples, the row refresh component 635 may be configured as or otherwise support a means for performing a refresh operation on the row based at least in part on determining that the quantity of activate operations performed on the row satisfies the threshold quantity of activate operations. In some examples, the row activation count component 625 may be configured as or otherwise support a means for resetting the quantity of activate operations performed on the row to zero based at least in part on performing the refresh operation.

In some examples, the row activation count component 625 may be configured as or otherwise support a means for determining, at a memory device, that a quantity of activate operations performed within a refresh duration on a row of a plurality of rows satisfies a threshold quantity of activate operations, where each row of the plurality of rows is associated with a respective threshold quantity of activate operations. In some examples, the row activation count component 625 may be configured as or otherwise support a means for updating a count of a quantity of rows of the plurality of rows that each satisfy the respective threshold quantity of activate operations based at least in part on determining that the quantity of activate operations performed on the row satisfies the threshold quantity of activate operations. In some examples, the row threshold component 630 may be configured as or otherwise support a means for determining that the count of the quantity of rows satisfies a threshold quantity of rows within the refresh duration. In some examples, the row threshold component 630 may be configured as or otherwise support a means for setting a value of the threshold quantity of activate operations based at least in part on the count of the quantity of rows satisfying the threshold quantity of rows.

Figure 7:
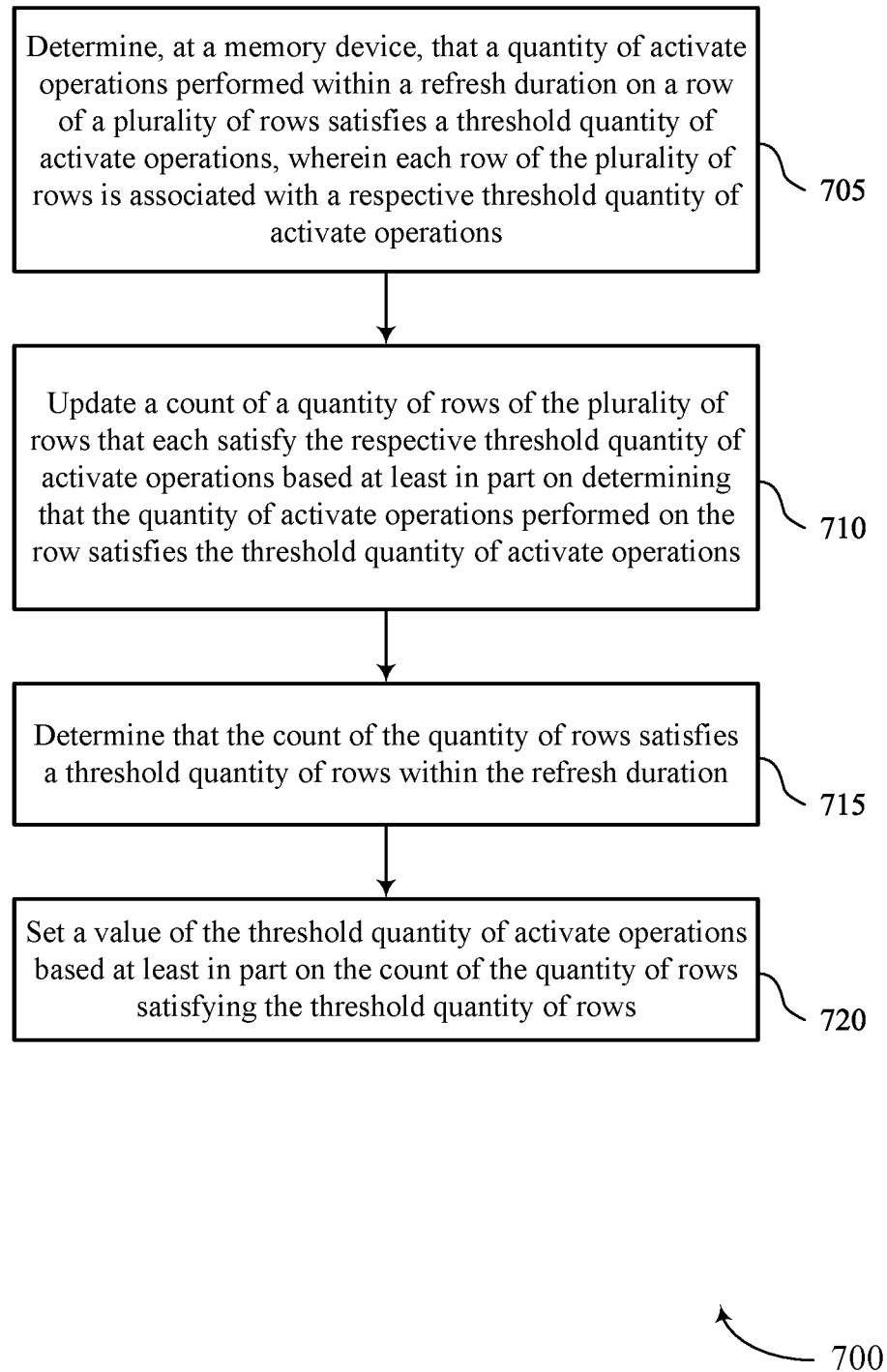
FIG. 7 shows a flowchart illustrating a method or methods that support dynamic row hammering threshold for memory in accordance with examples as disclosed herein.

FIG. 7 shows a flowchart illustrating a method 700 that supports dynamic row hammering threshold for memory in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 705, the method may include determining, at a memory device, that a quantity of activate operations performed within a refresh duration on a row of a plurality of rows satisfies a threshold quantity of activate operations, where each row of the plurality of rows is associated with a respective threshold quantity of activate operations. The operations of 705 may be performed in accordance with examples as disclosed herein. In some examples, aspects of the operations of 705 may be performed by a row activation count component 625 as described with reference to FIG. 6.

At 710, the method may include updating a count of a quantity of rows of the plurality of rows that each satisfy the respective threshold quantity of activate operations based at least in part on determining that the quantity of activate operations performed on the row satisfies the threshold quantity of activate operations. The operations of 710 may be performed in accordance with examples as disclosed herein. In some examples, aspects of the operations of 710 may be performed by a row activation count component 625 as described with reference to FIG. 6.

At 715, the method may include determining that the count of the quantity of rows satisfies a threshold quantity of rows within the refresh duration. The operations of 715 may be performed in accordance with examples as disclosed herein. In some examples, aspects of the operations of 715 may be performed by a row threshold component 630 as described with reference to FIG. 6.

At 720, the method may include setting a value of the threshold quantity of activate operations based at least in part on the count of the quantity of rows satisfying the threshold quantity of rows. The operations of 720 may be performed in accordance with examples as disclosed herein. In some examples, aspects of the operations of 720 may be performed by a row threshold component 630 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for determining, at a memory device, that a quantity of activate operations performed within a refresh duration on a row of a plurality of rows satisfies a threshold quantity of activate operations, where each row of the plurality of rows is associated with a respective threshold quantity of activate operations; updating a count of a quantity of rows of the plurality of rows that each satisfy the respective threshold quantity of activate operations based at least in part on determining that the quantity of activate operations performed on the row satisfies the threshold quantity of activate operations; determining that the count of the quantity of rows satisfies a threshold quantity of rows within the refresh duration; and setting a value of the threshold quantity of activate operations based at least in part on the count of the quantity of rows satisfying the threshold quantity of rows.

Aspect 2: The method, apparatus, or non-transitory computer-readable medium of aspect 1 where setting the value of the threshold quantity of activate operations includes operations, features, circuitry, logic, means, or instructions, or any combination thereof for reducing the value of the threshold quantity of activate operations from a first value to a second value that is less than the first value based at least in part on the count of the quantity of rows satisfying the threshold quantity of rows.

Aspect 3: The method, apparatus, or non-transitory computer-readable medium of any of aspects 1 through 2, further including operations, features, circuitry, logic, means, or instructions, or any combination thereof for altering a frequency for refreshing the quantity of rows based at least in part on the count of the quantity of rows satisfying the threshold quantity of rows.

Aspect 4: The method, apparatus, or non-transitory computer-readable medium of any of aspects 1 through 3, further including operations, features, circuitry, logic, means, or instructions, or any combination thereof for identifying a second quantity of activate operations performed across the plurality of rows within the refresh duration, where setting the value of the threshold quantity of activate operations is based at least in part on the second quantity of activate operations.

Aspect 5: The method, apparatus, or non-transitory computer-readable medium of aspect 4, further including operations, features, circuitry, logic, means, or instructions, or any combination thereof for determining that the second quantity of activate operations is greater than a second threshold quantity of activate operations, where setting the value of the threshold quantity of activate operations includes reducing the value of the threshold quantity of activate operations based at least in part on the second quantity of activate operations satisfying the second threshold quantity of activate operations.

Aspect 6: The method, apparatus, or non-transitory computer-readable medium of any of aspects 1 through 5 where the threshold quantity of rows is based at least in part on a duration between activate commands and the refresh duration.

Aspect 7: The method, apparatus, or non-transitory computer-readable medium of any of aspects 1 through 6 where the threshold quantity of activate operations associated with the row is the same as other threshold quantities of activate operations associated with other rows of the plurality of rows.

Aspect 8: The method, apparatus, or non-transitory computer-readable medium of any of aspects 1 through 7 where the threshold quantity of activate operations associated with the row is different than other threshold quantities of activate operations for other rows of the plurality of rows and the other threshold quantities of activate operations for the other rows vary within a range of quantities that includes the threshold quantity of activate operations.

Aspect 9: The method, apparatus, or non-transitory computer-readable medium of aspect 8 where variations between threshold quantities of activate operations within the range of quantities are randomly generated.

Aspect 10: The method, apparatus, or non-transitory computer-readable medium of any of aspects 1 through 9, further including operations, features, circuitry, logic, means, or instructions, or any combination thereof for setting a corresponding value for each respective threshold quantity of activate operations associated with each row of the plurality of rows based at least in part on the count of the quantity of rows satisfying the threshold quantity of rows, where setting the value of the threshold quantity of activate operations is based at least in part on setting the corresponding values for the respective threshold quantities of activate operations.

Aspect 11: The method, apparatus, or non-transitory computer-readable medium of any of aspects 1 through 10, further including operations, features, circuitry, logic, means, or instructions, or any combination thereof for determining a first value of a first counter associated with a first time period less than or equal to the refresh duration, where the count of the quantity of rows is based at least in part on the first value of the first counter and determining a second value of a second counter associated with a second time period less than or equal to the refresh duration, where the second time period starts after the first time period and at least partially overlaps with the first time period.

Aspect 12: The method, apparatus, or non-transitory computer-readable medium of any of aspects 1 through 11 where updating the count of the quantity of rows is based at least in part on information associated with the plurality of rows stored in a content-addressable memory.

Aspect 13: The method, apparatus, or non-transitory computer-readable medium of any of aspects 1 through 12, further including operations, features, circuitry, logic, means, or instructions, or any combination thereof for reducing the count of the quantity of rows based at least in part on performing a refresh operation for one or more rows of the quantity of rows.

Aspect 14: The method, apparatus, or non-transitory computer-readable medium of any of aspects 1 through 13, further including operations, features, circuitry, logic, means, or instructions, or any combination thereof for performing a refresh operation on the row based at least in part on determining that the quantity of activate operations performed on the row satisfies the threshold quantity of activate operations and resetting the quantity of activate operations performed on the row to zero based at least in part on performing the refresh operation.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 15: An apparatus, including: a memory array; and a controller couplable with the memory array and operable to cause the apparatus to: determine that a quantity of activate operations performed within a refresh duration on a row of a plurality of rows satisfies a threshold quantity of activate operations, where each row of the plurality of rows is associated with a respective threshold quantity of activate operations; update a count of a quantity of rows of the plurality of rows that each satisfy the respective threshold quantity of activate operations based at least in part on determining that the quantity of activate operations performed on the row satisfies the threshold quantity of activate operations; determine that the count of the quantity of rows satisfies a threshold quantity of rows within the refresh duration; and set a value of the threshold quantity of activate operations based at least in part on the count of the quantity of rows satisfying the threshold quantity of rows.

Aspect 16: The apparatus of aspect 15, where the controller is further operable to set the value of the threshold quantity of activate operations based at least in part on causing the apparatus to: reduce the value of the threshold quantity of activate operations from a first value to a second value that is less than the first value based at least in part on the count of the quantity of rows satisfying the threshold quantity of rows.

Aspect 17: The apparatus of any of aspects 15 through 16, where the controller is further operable to cause the apparatus to: alter a frequency for refreshing the quantity of rows based at least in part on the count of the quantity of rows satisfying the threshold quantity of rows.

Aspect 18: The apparatus of any of aspects 15 through 17, where the controller is further operable to cause the apparatus to: identify a second quantity of activate operations performed across the plurality of rows within the refresh duration, where setting the value of the threshold quantity of activate operations is based at least in part on the second quantity of activate operations.

Aspect 19: The apparatus of aspect 18, where the controller is further operable to cause the apparatus to: determine that the second quantity of activate operations is greater than a second threshold quantity of activate operations, where setting the value of the threshold quantity of activate operations includes reducing the value of the threshold quantity of activate operations based at least in part on the second quantity of activate operations satisfying the second threshold quantity of activate operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    determining, at a memory device, that a quantity of activate operations performed within a refresh duration on a row of a plurality of rows satisfies a threshold quantity of activate operations, wherein each row of the plurality of rows is associated with a respective threshold quantity of activate operations;
    updating a count of a quantity of rows of the plurality of rows that each satisfy the respective threshold quantity of activate operations based at least in part on determining that the quantity of activate operations performed on the row satisfies the threshold quantity of activate operations;
    determining that the count of the quantity of rows satisfies a threshold quantity of rows within the refresh duration; and
    setting a value of the threshold quantity of activate operations based at least in part on the count of the quantity of rows satisfying the threshold quantity of rows.

2. The method of claim 1, wherein setting the value of the threshold quantity of activate operations comprises:
    reducing the value of the threshold quantity of activate operations from a first value to a second value that is less than the first value based at least in part on the count of the quantity of rows satisfying the threshold quantity of rows.

3. The method of claim 1, further comprising:
    altering a frequency for refreshing the quantity of rows based at least in part on the count of the quantity of rows satisfying the threshold quantity of rows.

4. The method of claim 1, further comprising:
    identifying a second quantity of activate operations performed across the plurality of rows within the refresh duration, wherein setting the value of the threshold quantity of activate operations is based at least in part on the second quantity of activate operations.

5. The method of claim 4, further comprising:
    determining that the second quantity of activate operations is greater than a second threshold quantity of activate operations, wherein setting the value of the threshold quantity of activate operations comprises reducing the value of the threshold quantity of activate operations based at least in part on the second quantity of activate operations satisfying the second threshold quantity of activate operations.

6. The method of claim 1, wherein the threshold quantity of rows is based at least in part on a duration between activate commands and the refresh duration.

7. The method of claim 1, wherein the threshold quantity of activate operations associated with the row is the same as other threshold quantities of activate operations associated with other rows of the plurality of rows.

8. The method of claim 1, wherein:
    the threshold quantity of activate operations associated with the row is different than other threshold quantities of activate operations for other rows of the plurality of rows; and
    the other threshold quantities of activate operations for the other rows vary within a range of quantities that includes the threshold quantity of activate operations.

9. The method of claim 8, wherein variations between threshold quantities of activate operations within the range of quantities are randomly generated.

10. The method of claim 1, further comprising:
    setting a corresponding value for each respective threshold quantity of activate operations associated with each row of the plurality of rows based at least in part on the count of the quantity of rows satisfying the threshold quantity of rows, wherein setting the value of the threshold quantity of activate operations is based at least in part on setting the corresponding values for the respective threshold quantities of activate operations.

11. The method of claim 1, further comprising:
    determining a first value of a first counter associated with a first time period less than or equal to the refresh duration, wherein the count of the quantity of rows is based at least in part on the first value of the first counter; and
    determining a second value of a second counter associated with a second time period less than or equal to the refresh duration, wherein the second time period starts after the first time period and at least partially overlaps with the first time period.

12. The method of claim 1, wherein updating the count of the quantity of rows is based at least in part on information associated with the plurality of rows stored in a content-addressable memory.

13. The method of claim 1, further comprising:
    reducing the count of the quantity of rows based at least in part on performing a refresh operation for one or more rows of the quantity of rows.

14. The method of claim 1, further comprising:
    performing a refresh operation on the row based at least in part on determining that the quantity of activate operations performed on the row satisfies the threshold quantity of activate operations; and
    resetting the quantity of activate operations performed on the row to zero based at least in part on performing the refresh operation.

15. An apparatus, comprising:
    a memory array; and
    a controller couplable with the memory array and operable to cause the apparatus to:
        determine that a quantity of activate operations performed within a refresh duration on a row of a plurality of rows satisfies a threshold quantity of activate operations, wherein each row of the plurality of rows is associated with a respective threshold quantity of activate operations;
        update a count of a quantity of rows of the plurality of rows that each satisfy the respective threshold quantity of activate operations based at least in part on determining that the quantity of activate operations performed on the row satisfies the threshold quantity of activate operations;

determine that the count of the quantity of rows satisfies a threshold quantity of rows within the refresh duration; and set a value of the threshold quantity of activate operations based at least in part on the count of the quantity of rows satisfying the threshold quantity of rows.

16. The apparatus of claim 15, wherein the controller is further operable to set the value of the threshold quantity of activate operations based at least in part on causing the apparatus to:

reduce the value of the threshold quantity of activate operations from a first value to a second value that is less than the first value based at least in part on the count of the quantity of rows satisfying the threshold quantity of rows.

17. The apparatus of claim 15, wherein the controller is further operable to cause the apparatus to:

alter a frequency for refreshing the quantity of rows based at least in part on the count of the quantity of rows satisfying the threshold quantity of rows.

18. The apparatus of claim 15, wherein the controller is further operable to cause the apparatus to:

identify a second quantity of activate operations performed across the plurality of rows within the refresh duration, wherein setting the value of the threshold quantity of activate operations is based at least in part on the second quantity of activate operations.

19. The apparatus of claim 18, wherein the controller is further operable to cause the apparatus to:

determine that the second quantity of activate operations is greater than a second threshold quantity of activate operations, wherein setting the value of the threshold quantity of activate operations comprises reducing the value of the threshold quantity of activate operations based at least in part on the second quantity of activate operations satisfying the second threshold quantity of activate operations.

20. A non-transitory computer-readable medium storing code comprising instructions which, when executed by a processor of an electronic device, cause the electronic device to:

determine, at a memory device, that a quantity of activate operations performed within a refresh duration on a row of a plurality of rows satisfies a threshold quantity of activate operations, wherein each row of the plurality of rows is associated with a respective threshold quantity of activate operations;

update a count of a quantity of rows of the plurality of rows that each satisfy the respective threshold quantity of activate operations based at least in part on determining that the quantity of activate operations performed on the row satisfies the threshold quantity of activate operations;

determine that the count of the quantity of rows satisfies a threshold quantity of rows within the refresh duration; and set a value of the threshold quantity of activate operations based at least in part on the count of the quantity of rows satisfying the threshold quantity of rows.

* * * * *